(12) United States Patent
Huang et al.

(10) Patent No.: US 11,937,515 B2
(45) Date of Patent: Mar. 19, 2024

(54) MRAM STRUCTURE FOR BALANCED LOADING

(71) Applicant: Taiwan Semiconductor Manufacturing Co., Ltd., Hsinchu (TW)

(72) Inventors: Chih-Fan Huang, Kaohsiung (TW); Hsiang-Ku Shen, Hsinchu (TW); Liang-Wei Wang, Hsinchu (TW); Chen-Chiu Huang, Hsinchu (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/884,221

(22) Filed: Aug. 9, 2022

(65) Prior Publication Data

US 2022/0384712 A1    Dec. 1, 2022

Related U.S. Application Data

(62) Division of application No. 17/002,098, filed on Aug. 25, 2020, now Pat. No. 11,716,910.

(51) Int. Cl.
*H10N 50/80*    (2023.01)
*H10B 61/00*    (2023.01)
*H10N 50/01*    (2023.01)

(52) U.S. Cl.
CPC ............. *H10N 50/80* (2023.02); *H10B 61/22* (2023.02); *H10N 50/01* (2023.02)

(58) Field of Classification Search
CPC ........ H10N 50/80; H10N 50/01; H10B 61/22
USPC ....................................................... 257/427
See application file for complete search history.

(56) References Cited

U.S. PATENT DOCUMENTS

| | | | |
|---|---|---|---|
| 10,685,693 B2 | 6/2020 | Ying et al. | |
| 2004/0188733 A1* | 9/2004 | Asao | H10B 61/22 257/E27.005 |
| 2008/0096290 A1* | 4/2008 | Smith | H10N 50/01 438/3 |
| 2010/0003767 A1* | 1/2010 | Cho | H10N 50/01 257/E21.001 |
| 2015/0236251 A1* | 8/2015 | Noh | H10B 61/00 438/3 |
| 2017/0092693 A1* | 3/2017 | Tan | H10N 50/01 |
| 2017/0104029 A1* | 4/2017 | Li | H10N 50/10 |
| 2018/0040813 A1* | 2/2018 | Han | H10B 61/22 |
| 2019/0006416 A1* | 1/2019 | Lee | H10N 59/00 |

(Continued)

*Primary Examiner* — Jami Valentine Miller
(74) *Attorney, Agent, or Firm* — HAYNES AND BOONE, LLP (57) ABSTRACT

Semiconductor device and methods of forming the same are provided. A semiconductor device according to one embodiment includes a dielectric layer including a top surface, a plurality of magneto-resistive memory cells disposed in the dielectric layer and including top electrodes, a first etch stop layer disposed over the dielectric layer, a common electrode extending through the first etch stop layer to be in direct contact with the top electrodes, and a second etch stop layer disposed on the first etch stop layer and the common electrode. Top surfaces of the top electrodes are coplanar with the top surface of the dielectric layer.

20 Claims, 11 Drawing Sheets

(56) References Cited

U.S. PATENT DOCUMENTS

| | | | |
|---|---|---|---|
| 2019/0013354 A1* | 1/2019 | Lee | G11C 11/161 |
| 2019/0164584 A1* | 5/2019 | Chuang | H10N 50/85 |
| 2020/0006638 A1* | 1/2020 | Chen | H10B 61/22 |
| 2020/0136027 A1 | 4/2020 | Wu et al. | |
| 2021/0118693 A1* | 4/2021 | Joy | H01L 21/76805 |
| 2022/0140002 A1* | 5/2022 | Lin | H10B 61/00 |
| | | | 257/427 |
| 2022/0263016 A1* | 8/2022 | Wang | H10N 50/01 |

* cited by examiner

MRAM STRUCTURE FOR BALANCED LOADING

PRIORITY DATA

This application is a divisional application of U.S. patent application Ser. No. 17/002,098, filed Aug. 35, 2020, the entirety of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Modern day electronic devices contain volatile or non-volatile electronic memory to store data. Volatile memory stores data while it is powered, while non-volatile memory is able to retain stored data when power is removed. Magneto-resistive random-access memory (MRAM) is one promising candidate for a next generation non-volatile memory technology. MRAM devices may be embedded in an interconnect structure disposed over a device substrate and are controlled by driving transistors on the device substrate. As the critical dimensions of the driving transistors shrink, changes are also made to MRAM devices. While existing MRAM structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow may be typically divided into three categories: front-end-of-line (FEOL) processes, middle-end-of-line (MEOL) processes, and back-end-of-line (BEOL) processes. FEOL processes generally encompasses processes related to fabricating active IC devices, such as transistors. For example, FEOL processes may include forming isolation features, gate structures, and source/drain features. MEOL processes generally encompasses processes related to fabricating contacts to features of the IC devices, such as contacts to the gate structures and/or the source/drain features. BEOL processes generally encompasses processes related to fabricating an interconnect structure that interconnects IC features fabricated at the FEOL level by way of contact formed at the MEOL level. In some embodiments, MRAM devices are fabricated at the BEOL level and may be embedded in the interconnect structure. Features fabricated by FEOL processes may be referred to as FEOL features. Features fabricated by MEOL processes may be referred to as MEOL features. Features fabricated by BEOL processes may be referred to as BEOL features.

A bit cell of a Magneto-resistive random-access memory (MRAM) device includes a magnetic tunnel junction (MTJ) vertically arranged between conductive electrodes. The MTJ includes a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned magnetic layer. The parallel configuration provides for a low resistance state that digitally stores data as a first bit value (e.g., a logical "0"). The anti-parallel configuration provides for a high resistance state that digitally stores data as a second bit value (e.g., a logical "1"). The switching between the two configurations provides two magnetic states of the MTJ. The magnetic state of the MTJ is set by application of a write current of appropriate amplitude and polarity, or read out by application of a read current to apply a voltage to a sense circuit. Depending on the resistance states of the bit cell, the voltage may be higher or lower.

A bit cell of an MRAM device includes a top electrode over the MTJ and a bottom electrode below the MTJ. In some implementations, the bit cell of an MRAM is controlled by a driving transistor disposed at the FEOL level. The driving transistor includes two second source/drain feature and a gate structure. The top electrode is coupled to a bit line (BL) and the bottom electrode is coupled to one of the two source/drain features of the driving transistor. A source line (SL) is electrically coupled to the other of the two source/drain features of the driving transistor. The gate structure of the driving transistor is coupled to a word line (WL). When the word line (WL) is selected by application of an enabling voltage, the driving transistor is turned on the bit cell is coupled between the bit line (BL) and the source line (SL). The bit line (BL) may also be coupled to a switching transistor.

Conventionally, the top electrode of each of the bit cells is individually coupled to a bit line (BL) by way of a contact via. However, as the dimensions of the IC devices decrease, it become more and more challenging to perfectly align the contact vias and the top electrodes. When the contact vias and the top electrodes are misaligned, the contact resistance may increase and cause performance issues. To enlarge the process window, a common electrode may be shared by multiple bit cells. That is, top electrodes of multiple bit cells may be jointly coupled to the common electrode. As the common electrode is larger, the issue associated with satisfactorily aligning contact vias with the top electrodes may be resolved. In some conventional techniques, one or more low-k dielectric layers are formed over the top electrode and a metal fill layer is deposited into openings patterned in the one of more low-k dielectric layers to form the common electrode. In these conventional techniques, the one or more low-K dielectric layer functions to increase a thickness of the common electrode to reduce resistance. The one or more low-k dielectric layers may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), undoped silica glass (USG), and/or other suitable dielectric materials.

Continuing scaling-down gives rises to new challenges. As described above, the MRAM bit cells are disposed in an interconnect structure formed in BEOL processes while the driving transistors are formed in FEOL processes. Because dimensions of conductive features in an interconnect structure increase with the distance from the drive transistor, the resistance between the source line (SL) and the MTJ is greater than the parallel resistance between bit line and the common electrode by a resistance bias. In some instances, the resistance bias may be between about 200 Ohm and about 1000 Ohm. In high-switching read/write operations of MRAM bit cells, such a resistance bias may cause imbalance between the read operations and write operations. With respect to a free layer of an MRAM bit cell, the switching between the non-parallel state and the parallel requires application of voltage of different polarities. When the switching from the parallel state to the non-parallel state requires a different time or voltage than switching from the non-parallel state to the parallel state, the performance of the MRAM bit cell may be impacted. Efforts have been invested to reduce the resistance between the source line (SL) and the MTJ to reduce the resistance bias.

The present disclosure provides methods and structures to increase the parallel resistance between the bit line (BL) and the common electrode to reduce the resistance bias and to improve the performance of an MRAM device. In some embodiments, an etch stop layer is deposited over a workpiece that includes MRAM cells. The etch stop layer may be a single layer or a multi-layer. After the etch stop layer is deposited, the etch stop layer is patterned to form a common electrode opening. A common electrode is then formed in the common electrode opening by depositing a metal fill layer over the common electrode opening and planarizing the workpiece to remove excess materials. After the planarization, top surfaces of the common electrode and etch stop layer are coplanar. The common electrode is disposed in the etch stop layer. By omitting the low-k dielectric layers, a thickness of the common electrode is reduced. As a result, the parallel resistance between the bit line and the common electrode is reduced.

Figure 1:
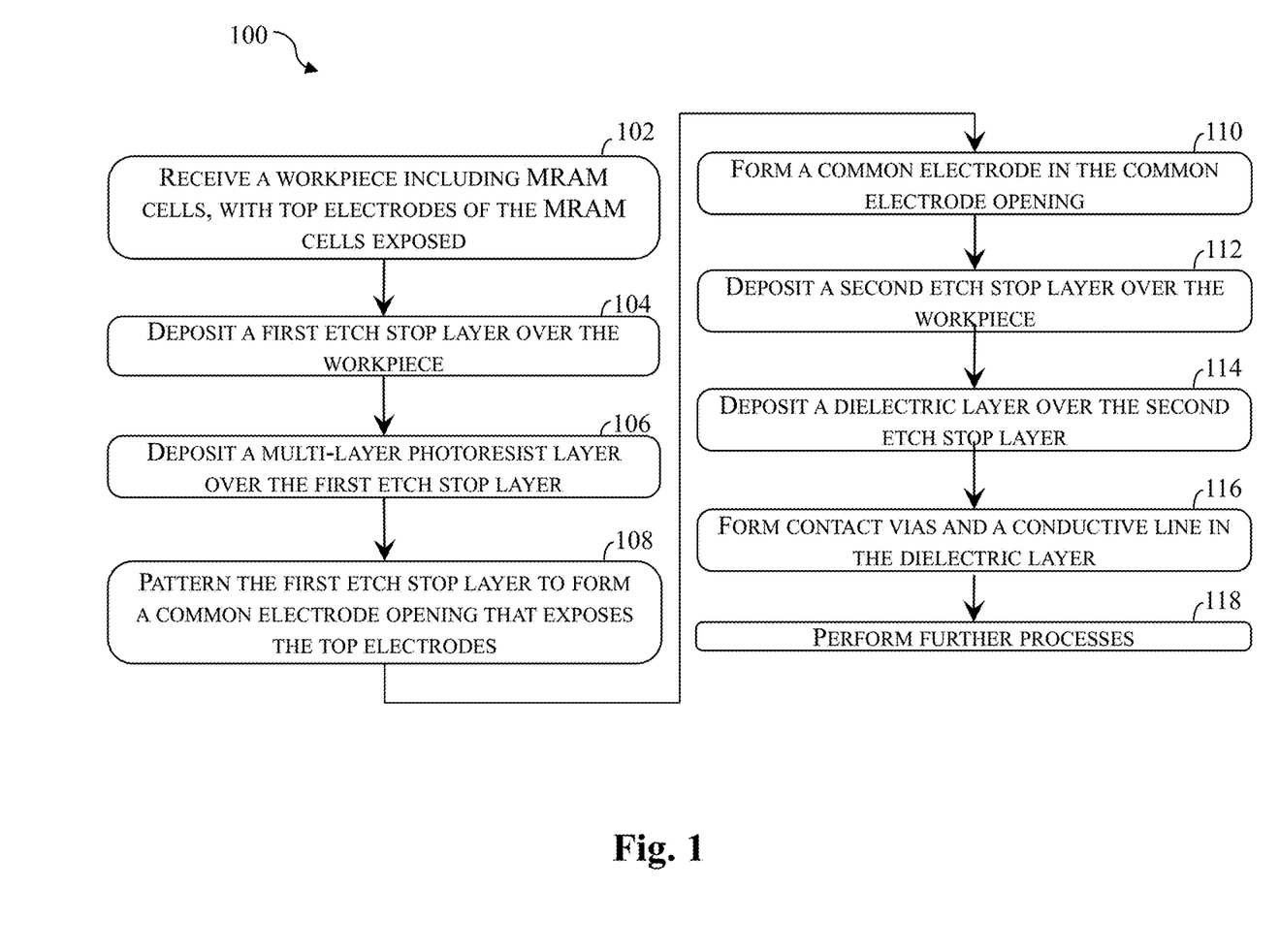
FIG. 1 illustrates a flow chart of a method for forming a semiconductor device, according to one or more aspects of the present disclosure.

The various aspects of the present disclosure will now be described in more detail with reference to the figures. FIG. 1 illustrates a flowchart illustrating method 100 for forming a semiconductor device according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with FIGS. 2-10, which include fragmentary cross-sectional views of a workpiece 200 at different stages of fabrication according to embodiments of method 100. For avoidance of doubts, throughout the figures, the X direction is perpendicular to the Y direction and the Z direction is perpendicular to both the X direction and the Y direction. Because the workpiece 200 will be formed into a semiconductor device upon conclusion of its fabrication process, the workpiece 200 may be referred to as a semiconductor device 200 as the context requires.

Figure 2:
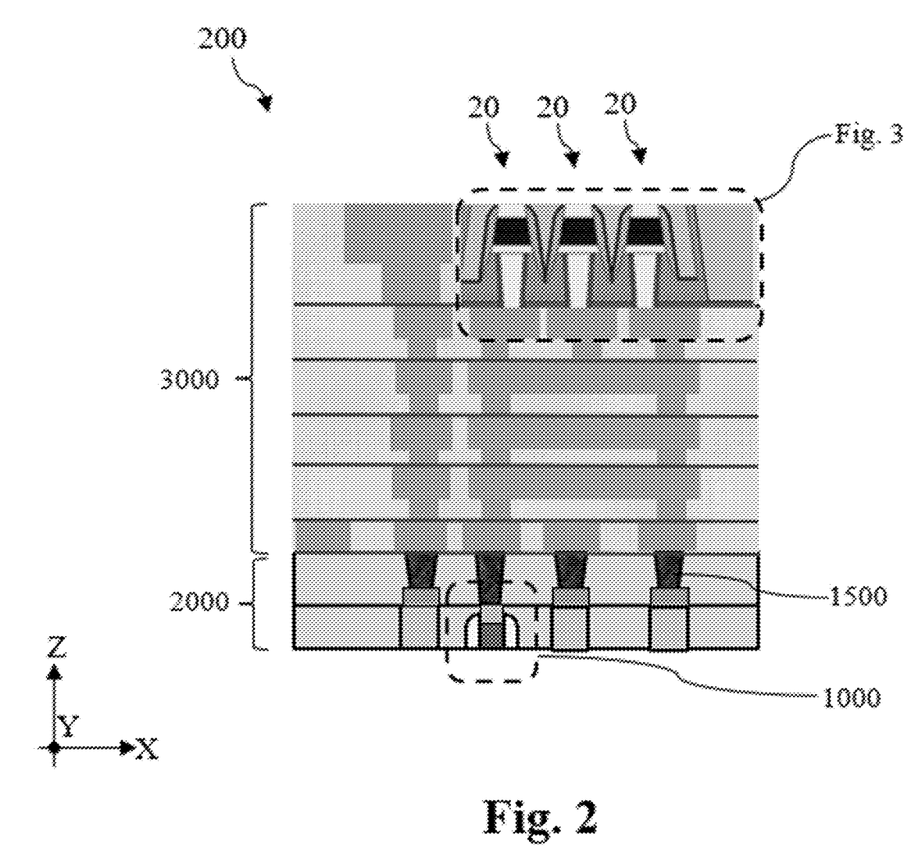
FIGS. 2-10 illustrate fragmentary cross-sectional views of a workpiece at various stages of fabrication of the method in FIG. 1, according to one or more aspects of the present disclosure.
Figure 3:
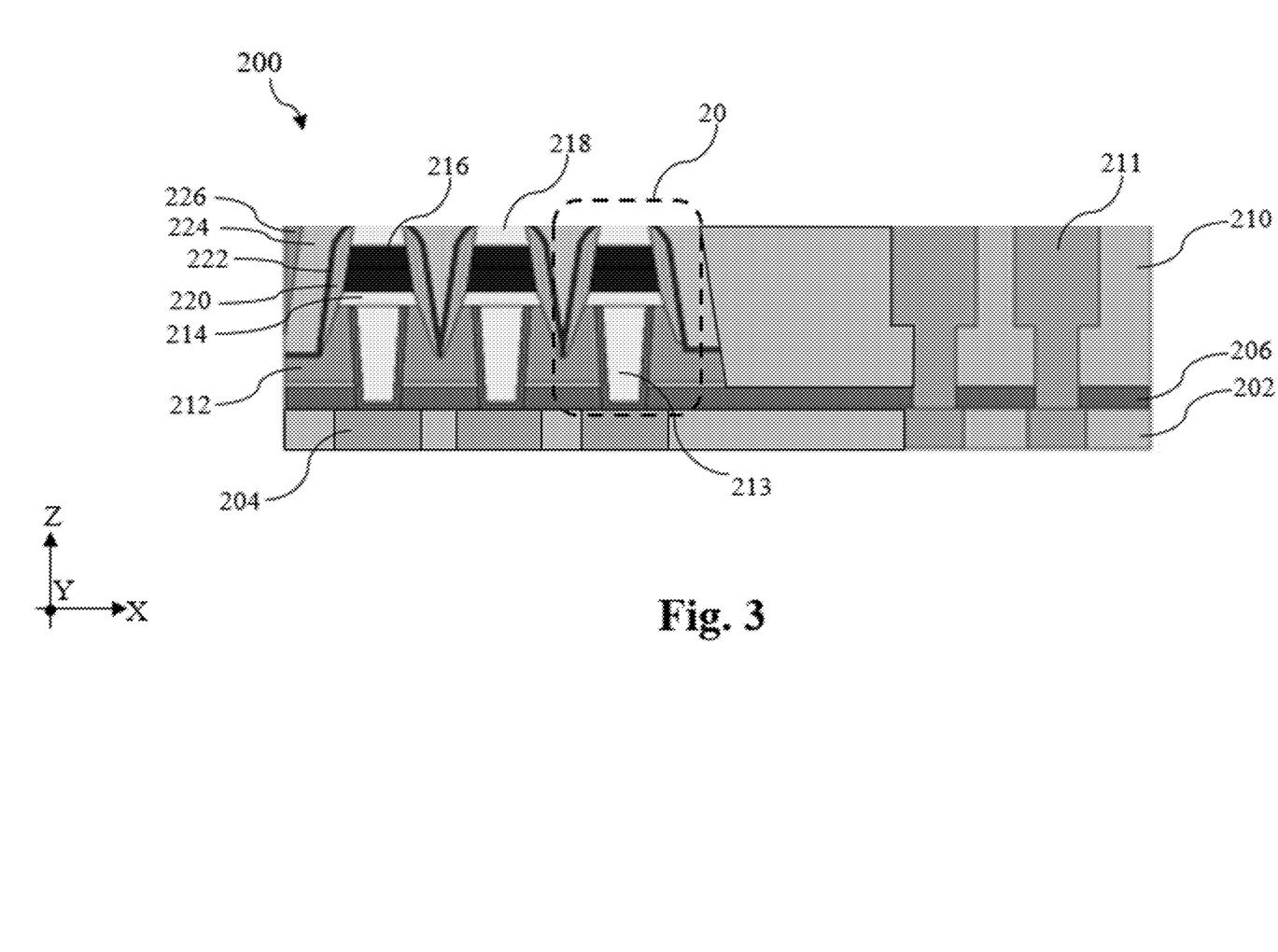

Referring to FIGS. 1, 2 and 3, method 100 includes a block 102 where a workpiece 200 is received. As shown in FIG. 2, the workpiece 200 may include a device substrate 2000 and an interconnect structure 3000 disposed over the device substrate 2000. The device substrate 2000 may include a semiconductor substrate, FEOL features on the semiconductor substrate, and MEOL features over the FEOL structures. The semiconductor substrate may be a silicon (Si) substrate. In some other embodiments, the semiconductor substrate may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The semiconductor substrate may also include an insulating layer, such as a silicon oxide layer, to have a silicon-on-insulator (SOI) structure. In embodiments depicted in FIG. 2, the FEOL features include a transistor 1000 and the MEOL features include contacts 1500, which include source/drain contacts and gate contacts.

The transistor 1000 may be a multi-gate device. Here, a multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may take form of nanowires, nanosheets, or other nanostructures and for that reasons, an MBC transistor may also be referred to as a nanowire transistor or a nanosheet transistor.

The interconnect structure 3000 shown in FIG. 2 may include between about 2 and about 8 interconnect layers, each of which includes contact vias and conductive lines embedded in an intermetal dielectric (IMD) layer. As will be described below, additional interconnect layers may be fabricated and the interconnect structure 3000 may include 9 or even more interconnect layers. The workpiece 200 includes a plurality of MRAM bit cells 20 (or MRAM cells 20). To illustrate further details of the MRAM bit cells 20, the dotted area in FIG. 2 is enlarged and shown in FIG. 3.

Referring to FIG. 3, the MRAM bit cells 20 are disposed over a lower intermetal dielectric (IMD) layer 202. Each of the MRAM bit cell 20 includes a bottom electrode 214, an MTJ structure 216 over the bottom electrode 214, and a top electrode 218 disposed over the MTJ structure 216. Each of the bottom electrodes 214 is coupled to a bottom contact via 213 that extends through a bottom dielectric layer 212 and a bottom etch stop layer 206. For passivation purposes, sidewalls of the top electrode 218, the MTJ structure 216 and the bottom electrode 214 are lined by a first passivation layer 220 and a second passivation layer 222. A fill dielectric layer 224 is disposed over and between MRAM bit cells 20. A cap dielectric layer 226 is disposed over the fill dielectric layer 224. As shown in FIG. 3, each of the bottom electrodes 214 of the MRAM bit cells 20 is respectively coupled to a conductive feature 204 in the lower IMD layer 202. The MRAM bit cells 20 and one or more conductive features 211 are also disposed in a top IMD layer 210 that is disposed over the lower IMD layer 202.

In some embodiments, the lower IMD layer 202, the top IMD layer 210, the cap dielectric layer 226, and the bottom dielectric layer 212 may be formed of tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials, and may be deposited using spin-on coating or flowable chemical vapor deposition (FCVD). The bottom contact vias 213, the conductive features 204, and conductive features 211 may be formed of copper (Cu), cobalt (Co), tungsten (W), titanium nitride (TiN), or nickel (Ni) and may be formed using physical vapor deposition (PVD), metalorganic CVD (MOCVD), or a suitable method. In embodiments illustrated in FIG. 3, a liner may be disposed between the bottom contact vias 213 and the bottom dielectric layer 212 to prevent deterioration of the bottom contact vias 213. The liner may include titanium, titanium nitride, tantalum, or tantalum nitride. The top electrode 218 and the bottom electrode 214 may be formed of the same material. In one embodiment, the top electrode 218 and the bottom electrode 214 may be formed of titanium nitride (TiN). In some alternative embodiments, the top electrode 218 and the bottom electrode 214 may be formed of copper (Cu), tungsten (W), or nickel (Ni). While not explicitly shown in FIG. 3, the MTJ structure 216 includes a pinned layer, a tunnel barrier layer over the pinned layer, and a free layer disposed over the tunnel barrier layer. In some embodiments, the pinned layer may include cobalt (Co), iron (Fe), boron (B), ruthenium (Ru), or the like. The tunnel barrier layer may include magnesium oxide (MgO), aluminum oxide ($Al_2O_3$), or the like. The first free layer may include cobalt (Co), iron (Fe), boron (B), or the like. The bottom etch stop layer 206 may be a single layer or a multi-layer. In some embodiments, the bottom etch stop layer 206 may include silicon nitride, silicon carbonitride, aluminum oxide, zirconium oxide, or hafnium oxide. In some instances, the first passivation layer 220 includes silicon nitride or silicon carbonitride and the second passivation layer 222 includes aluminum oxide, zirconium oxide, or hafnium oxide. The fill dielectric layer 224 may include silicon oxide and may be deposited using ALD to fill in crevices between MRAM bit cells 20.

As shown in FIG. 3, the workpiece 200 may be planarized using a chemical mechanical polishing (CMP) process or other suitable processes to have a planar top surface. The top electrodes 218 are exposed in the planar top surface of the workpiece 200. That is, top surfaces of the top electrodes 218 may be coplanar with a top surface of the fill dielectric layer 224 or the cap dielectric layer 226, depending on the extent of the CMP process. In the embodiment depicted in FIG. 3, top surfaces of the top electrodes 218 are coplanar with a top surface of the fill dielectric layer 224.

Figure 4:
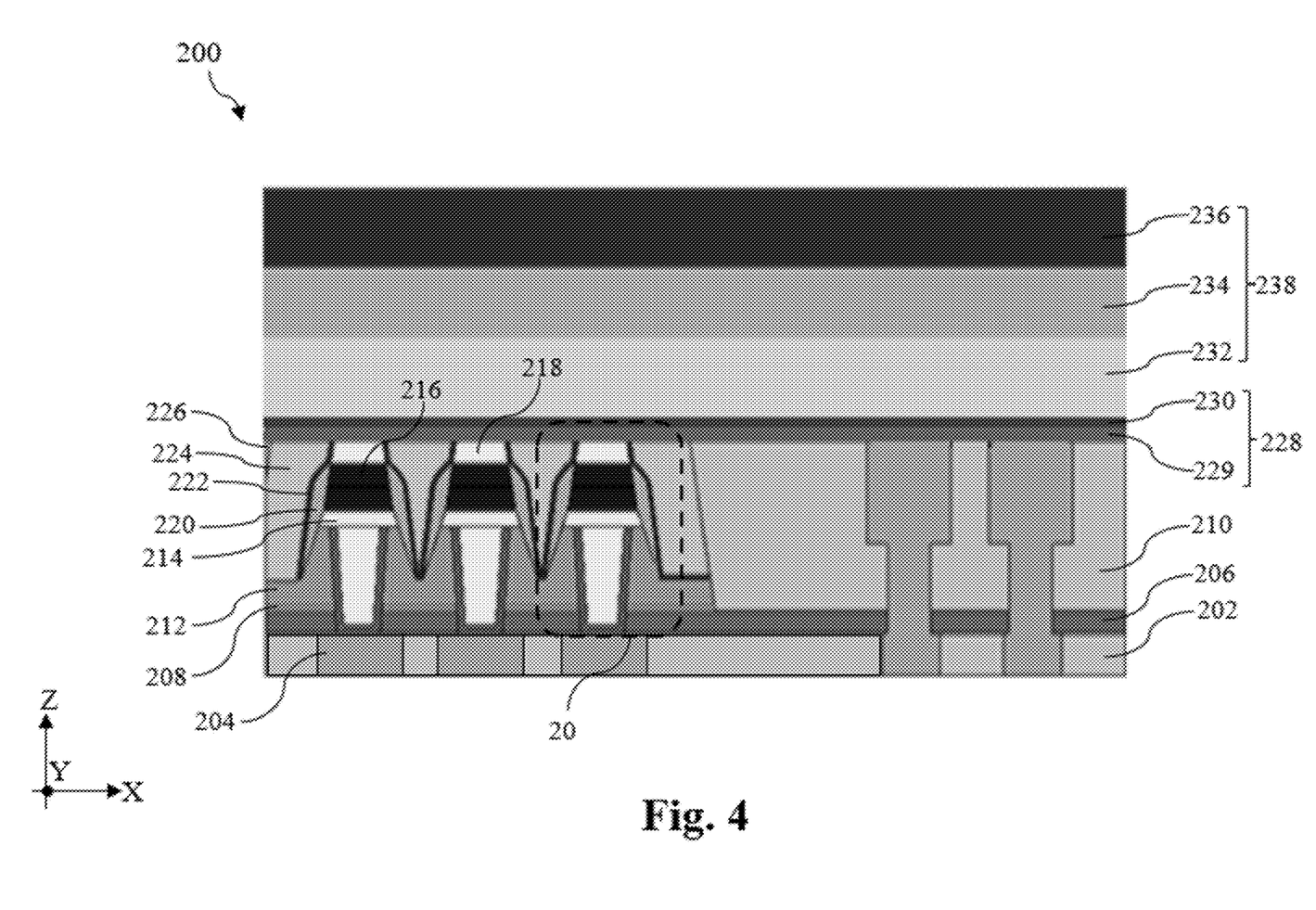

Referring to FIGS. 1 and 4, method 100 includes a block 104 where a first etch stop layer 228 is deposited over the workpiece 200. The first etch stop layer 228 may be a single layer or a multi-later. When the first etch stop layer 228 is a single layer, it may be formed of a nitrogen-containing dielectric material, such as silicon nitride or silicon carbonitride. When the first etch stop layer 228 is multi-layer, as shown in FIG. 4, the first etch stop layer 228 may include a first nitrogen-containing layer 229 and a first metal oxide layer 230 over the first nitrogen-containing layer 229. In some embodiments, the first nitrogen-containing layer 229 may include silicon nitride or silicon carbonitride and the first metal oxide layer 230 may include aluminum oxide, zirconium oxide, or hafnium oxide. In some embodiments, the first nitrogen-containing layer 229 has a thickness between about 50 Å and about 200 Å and the first metal oxide layer 230 has a thickness between about 20 Å and about 100 Å. According to the present disclosure, the first etch stop layer 228 not only serves as an etch stop layer but also serves to define a thickness of a common electrode (to be described below). Because the first etch stop layer 228 also serves to accommodate the common electrode, the first etch stop layer 228 is substantially thicker than other etch stop layers in the workpiece 200, such as the second etch stop layer 244 (shown in FIG. 7). In some implementations, a total thickness of the first etch stop layer 228 may be between about 200 Å and about 300 Å. When the total thickness is smaller than about 200 Å, defects may be developed when the first etch stop layer 228 undergoes a planarization process during formation of the common electrode.

Referring to FIGS. 1 and 4, method 100 includes a block 106 where a multi-layer photoresist layer 238 is deposited over the first etch stop layer 228. In some embodiments represented in FIG. 4, the multi-layer photoresist layer 238 may be a tri-layer that includes a bottom layer 232, a middle layer 234 over the bottom layer 232, and a top layer 236 over the middle layer 234. The bottom layer 232 and the middle layer 234 may include various organic or inorganic materials. The bottom layer 232 includes a photoresist material, an anti-reflective coating (ARC) material, and a polymer material. In one example, the bottom layer 232 may include a polymer that includes carbon (C), oxygen (O) and hydrogen (H). The middle layer 234 may include a silicon-containing polymer. In one example, the middle layer 234 includes silicon (Si), carbon (C), oxygen (O), and hydrogen (H). The top layer 236 may be a radiation-sensitive resist layer, such as a photoresist layer, disposed over the middle layer 234. The top layer 236 may be a positive-type or a negative-type resist.

Figure 5:
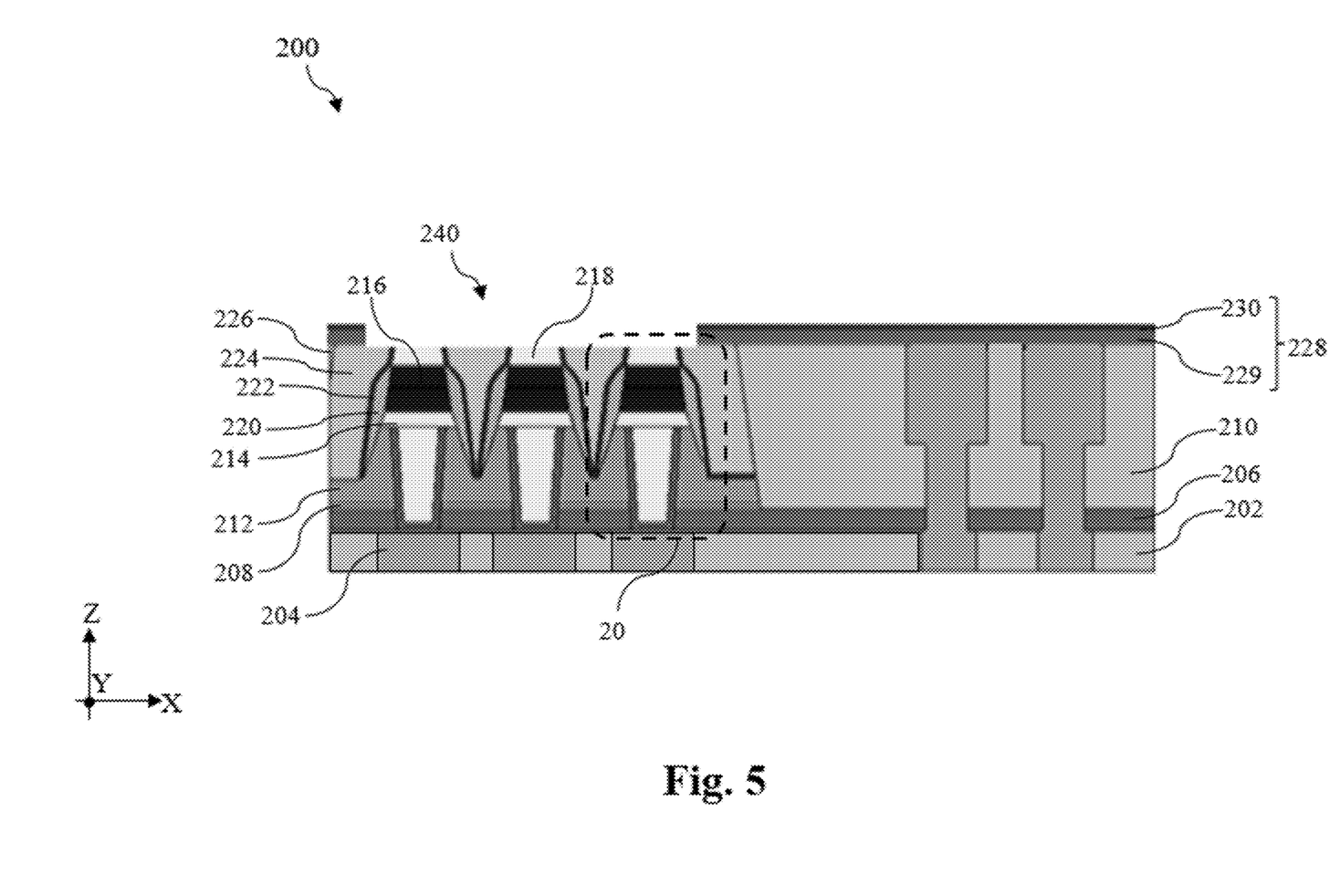

Referring to FIGS. 1 and 5, method 100 includes a block 108 where the first etch stop layer 228 is patterned to form a common electrode opening 240. After the deposition of the multi-layer photoresist layer 238, photolithography processes and etch processes are performed to pattern the first etch stop layer 228. An example photolithography process includes soft baking, exposure to radiation reflected from or transmitting through a photo mask, post-exposure baking, and developing of the multi-layer photoresist layer 238 to form a patterned multi-layer photoresist layer 238. After rinsing and drying (e.g., hard baking), the patterned multi-layer photoresist layer 238 is applied as an etch mask to etch the first etch stop layer 228. The etch process at block 108 may include a selective etch process or an anisotropic etch process. An example selective etch process may include use of phosphoric acid. An example anisotropic etch process may include a reactive-ion-etching (RIE) process that uses an oxygen-containing gas, hydrogen, a fluorine-containing gas (e.g., $CF_4$, $NF_3$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etch process at block 108 is timed to stop upon exposure of the top electrodes 218 in the common electrode opening 240. As shown in FIG. 5, all top electrodes 218 of the MRAM bit cells 20 are exposed in the common electrode opening 240. In addition, the fill dielectric layer 224 and the second passivation layer 222 are also exposed in the common electrode opening 240. The common electrode opening 240 is defined in the multi-layer photoresist layer 238.

Figure 6:
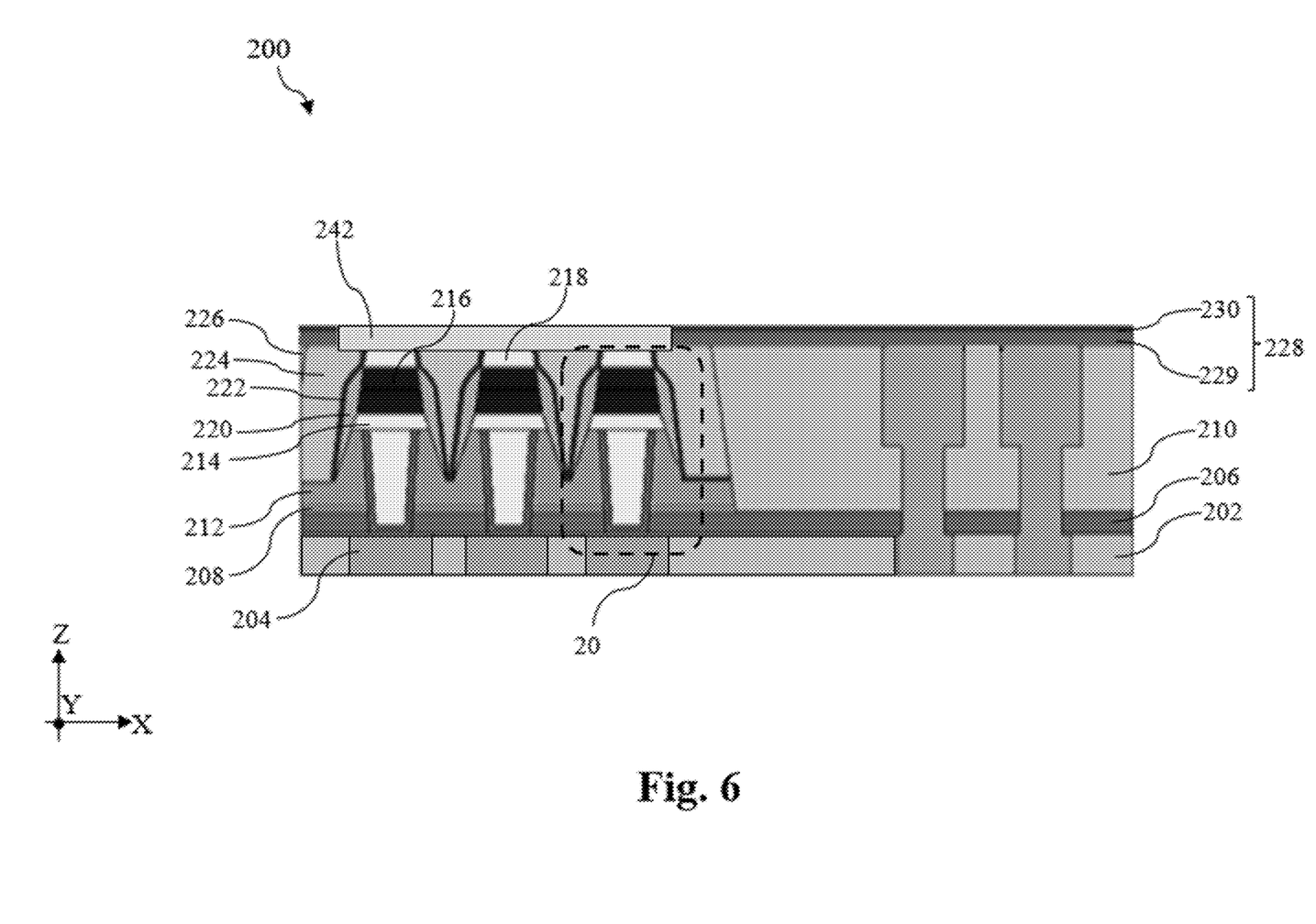

Referring to FIGS. 1 and 6, method 100 includes a block 110 where a common electrode 242 is formed in the common electrode opening 240. In some embodiments, the common electrode 242 may include titanium nitride (TiN), tantalum nitride (TaN), aluminum (Al), tungsten (W), nickel (Ni), titanium (Ti), ruthenium (Ru), cobalt (Co), platinum (Pt), copper (Cu), other refractory metals, or other suitable metal materials or a combination thereof. In an example process, a metal fill layer for the common electrode 242 is deposited over the workpiece 200, including over the common electrode opening 240, by ALD, PVD, CVD, e-beam evaporation, or other suitable process. In various embodiments, after the deposition of the metal fill layer, a planarization process, such as a CMP process, may be performed to remove excessive materials to provide a substantially planar top surface. Upon conclusion of the planarization process, a top surface of the common electrode 242 is coplanar with a top surface of the first etch stop layer 228. To be more precise, upon conclusion of the planarization process, a top surface of the common electrode 242 is coplanar with a top surface of the first metal oxide layer 230. As described above, the CMP process may need a sufficient thickness of the first etch stop layer 228 to provide buffer and end point control. For that reason, the total thickness of the first etch stop layer 228 before the CMP process may be between about 200 Å and about 300 Å. After the CMP process, the total thickness of the first etch stop layer 228 and the common electrode 242 may be between about 150 Å and about 280 Å. Because the top electrodes 218 are exposed in the common electrode opening 240 before the formation of the common electrode 242, the common electrode 242 is in direct contact with the top electrodes 218 upon conclusion of operations at block 110.

Because the thickness the common electrode 242 is defined only by the thickness of the first etch stop layer 228, the thickness the common electrode 242 is smaller than a would-be common electrode that is surrounded by both the first etch stop layer 228 and additional dielectric layers above it. As a result, the common electrode 242 may result in a reduced parallel resistance of the common electrode 242 and the bit line (BL) disposed over the common electrode 242. In some embodiments where further reduction of the parallel resistance is desired, the common electrode 242 and the top electrode 218 may be formed of different materials. For example, the common electrode 242 may be formed of titanium nitride (TiN), nickel (Ni), tungsten (W), tantalum nitride (TaN), titanium (T), tantalum (Ta), while the top electrode 218 is formed of copper (Cu). The less conductive common electrode 242 may help bring down the parallel resistance (i.e., the parallel resistance of the common electrode 242 and the bit line (BL) disposed over the common electrode 242) to balance the resistances for the write and read operations.

Figure 7:
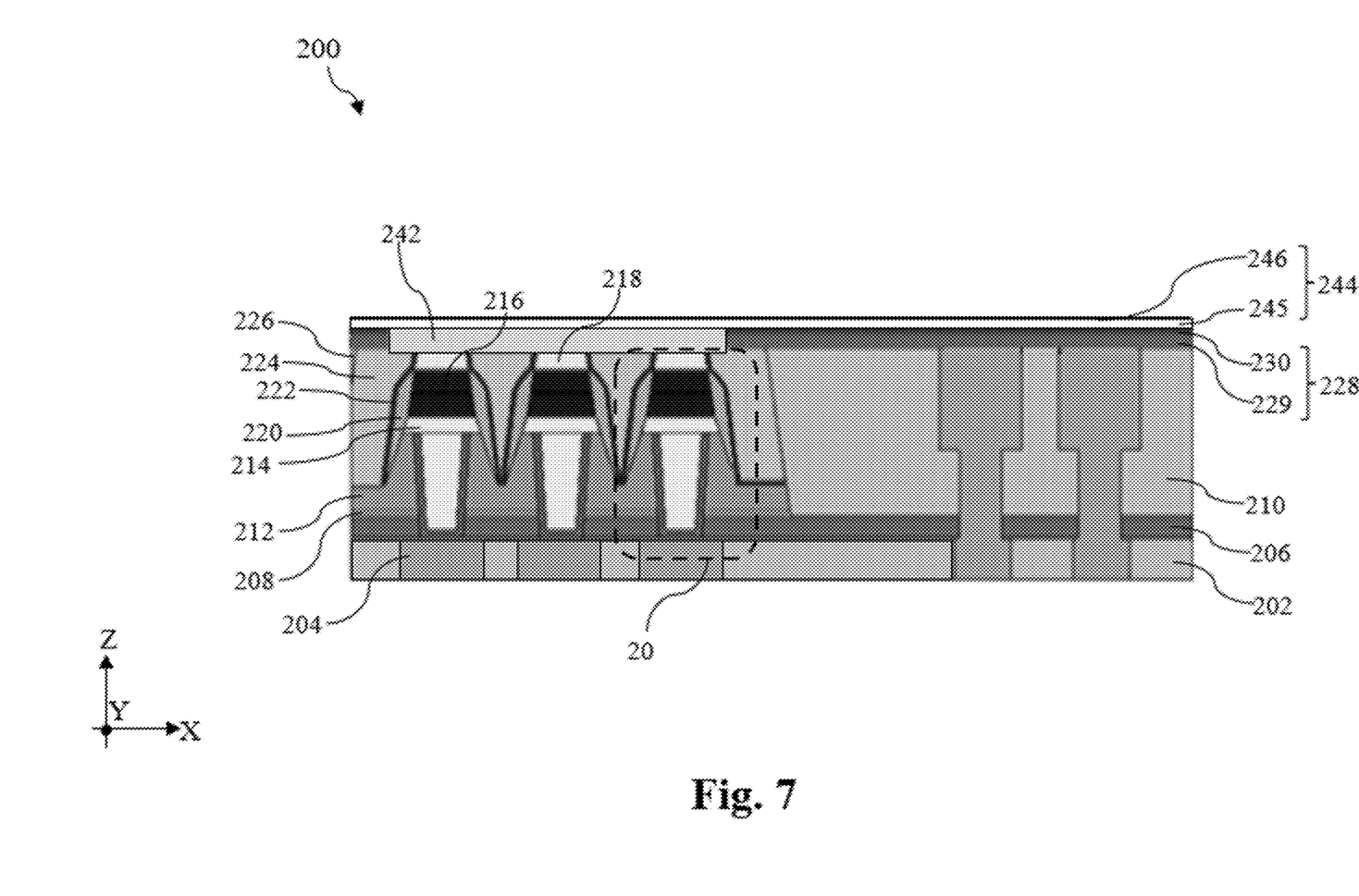

Referring to FIGS. 1 and 7, method 100 includes a block 112 where a second etch stop layer 244 is deposited over the workpiece 200. The second etch stop layer 244 may be a single layer or a multi-later. When the second etch stop layer 244 is a single layer, it may be formed of a nitrogen-containing dielectric material, such as silicon nitride or silicon carbonitride. When the second etch stop layer 244 is multi-layer, as shown in FIG. 7, the second etch stop layer 244 may include a second nitrogen-containing layer 245 and a second metal oxide layer 246 over the second nitrogen-containing layer 245. In some embodiments, the second nitrogen-containing layer 245 may include silicon nitride or silicon carbonitride and the second metal oxide layer 246 may include aluminum oxide, zirconium oxide, or hafnium oxide. The second nitrogen-containing layer 245 is thinner than the first nitrogen-containing layer 229 and the second metal oxide layer 246 is thinner than the first metal oxide layer 230. In some embodiments, the second nitrogen-containing layer 245 has a thickness between about 20 Å and about 100 Å and the second metal oxide layer 246 has a thickness between about 10 Å and about 50 Å. The total thickness of the first etch stop layer 228 is greater than a total thickness of the second etch stop layer 244. In some instances, the second etch stop layer 244 may be between about 100 Å and about 200 Å. Unlike the first etch stop layer 228, the thinner second etch stop layer 244 would not be thick enough to sustain the CMP process to form the common electrode 242. The second etch stop layer 244 is disposed on the common electrode 242 and the first etch stop layer 228. In the embodiments illustrated in FIG. 7, the second nitrogen-containing layer 245 is directly in contact with the first metal oxide layer 230 and is spaced apart from the first nitrogen-containing layer 229.

Figure 8:
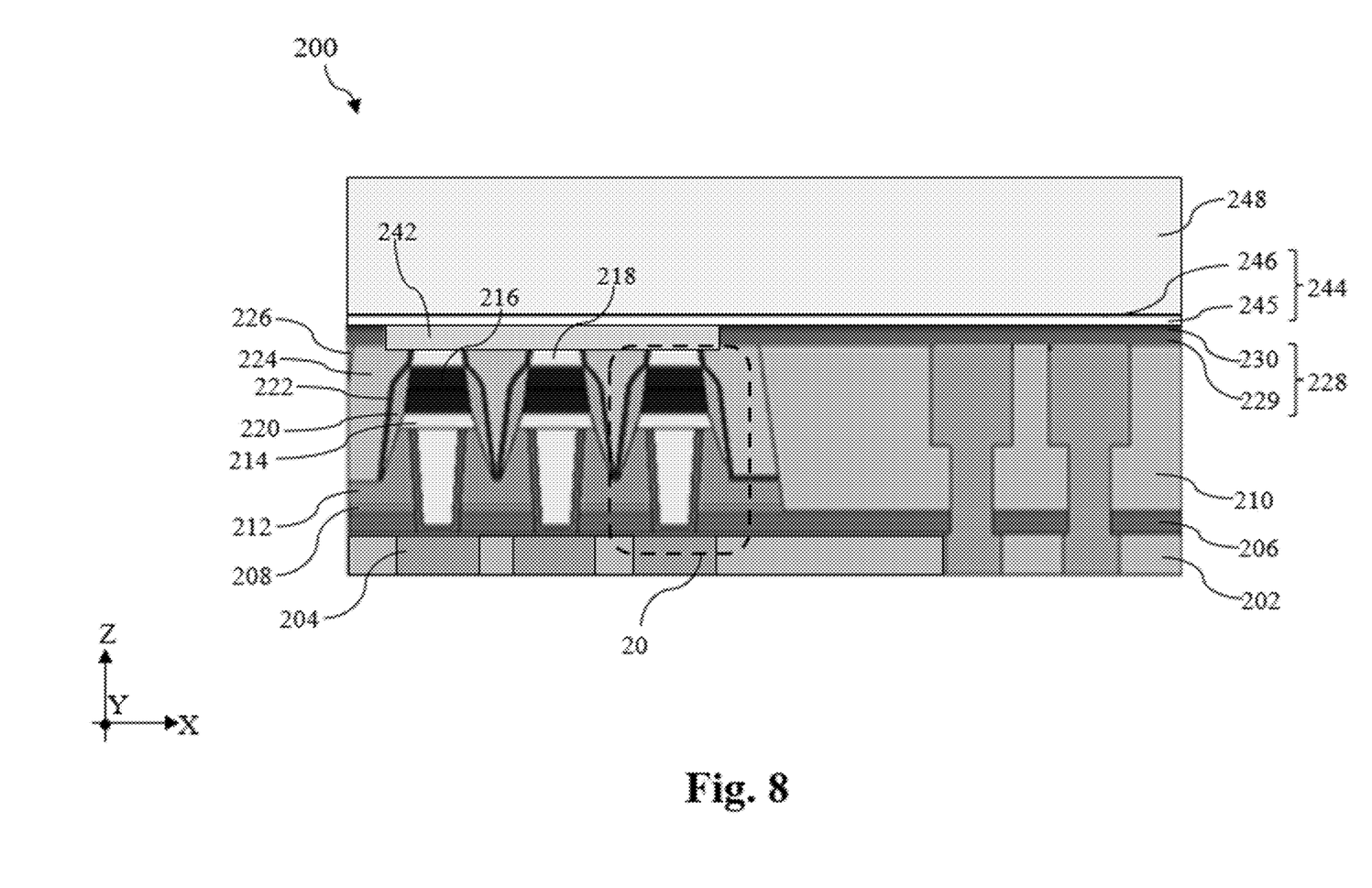

Referring to FIGS. 1 and 8, method 100 includes a block 114 where a dielectric layer 248 is deposited over the second etch stop layer 244. In some embodiments, the dielectric layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 248 may be deposited by spin-on coating, an FCVD process, or other suitable deposition technique. The dielectric layer 248 may be referred to as an intermetal dielectric (IMD) layer.

Figure 9:
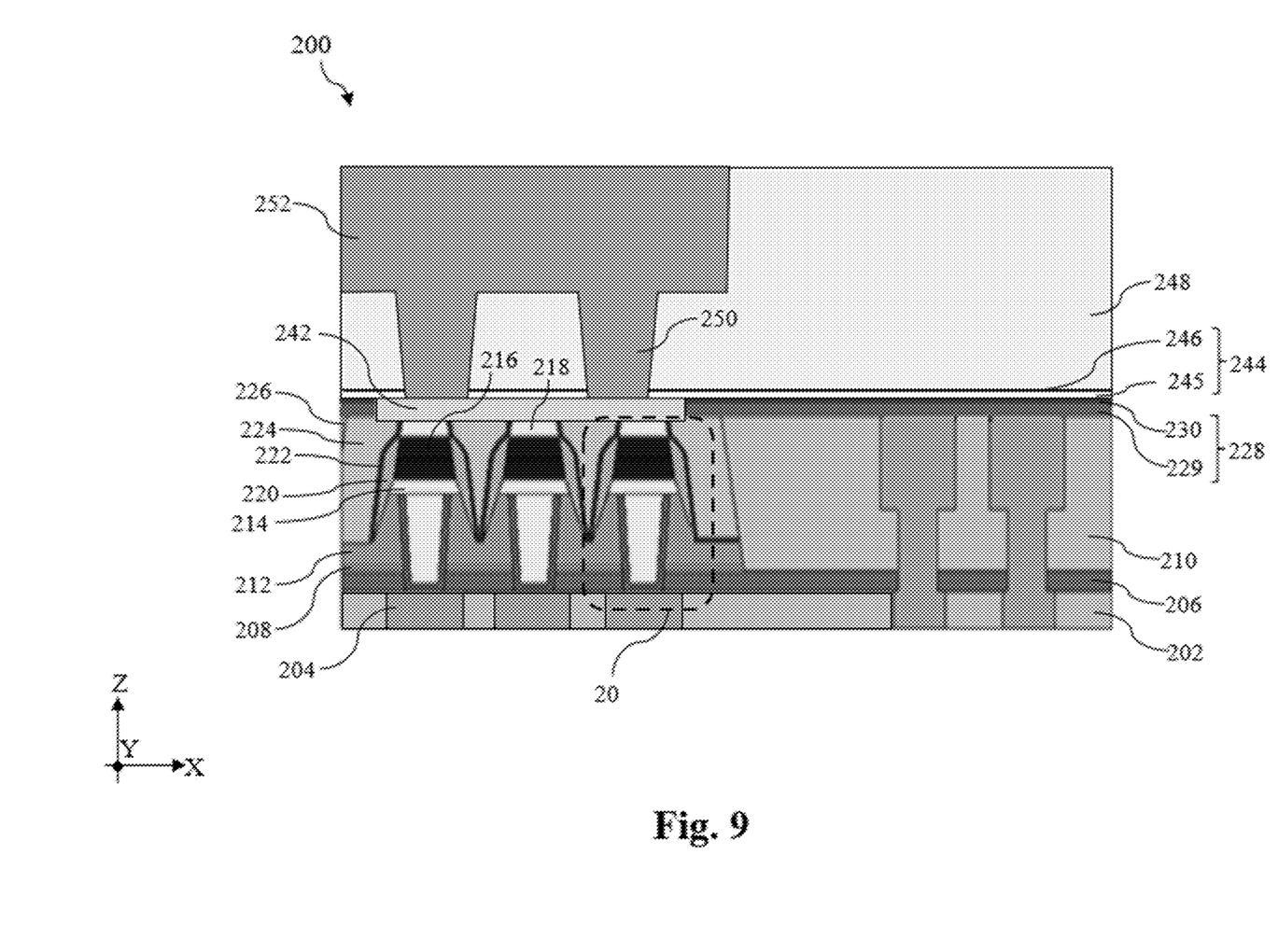

Referring to FIGS. 1 and 9, method 100 includes a block 116 where contact vias 250 and a conductive line 252 are formed in the dielectric layer 248. At block 116, a dual damascene process may be used to form the contact vias 250 and the conductive line 252 in the dielectric layer 248. In an example process, the dielectric layer 248 undergoes two patterning processes to form contact via openings and a trench over the contact via openings. A liner and a seed layer are then sequentially and conformally deposited in the contact via openings and the trench. In some instances, the liner may include titanium nitride and the seed layer may include titanium. Then a conductive material, such as aluminum (Al), tungsten (W), nickel (Ni), ruthenium (Ru), cobalt (Co), copper (Cu), is deposited in the contact via openings and the trench using electroplating. As shown in FIG. 9, the contact vias 250 are in direct contact with the common electrode 242. Because the top electrodes 218 are not individually addressed by the contact vias 250, the number of the contact vias 250 is smaller than the number of the top electrodes 218 or the number of conductive feature 204 in the lower IMD layer 202.

Figure 10:
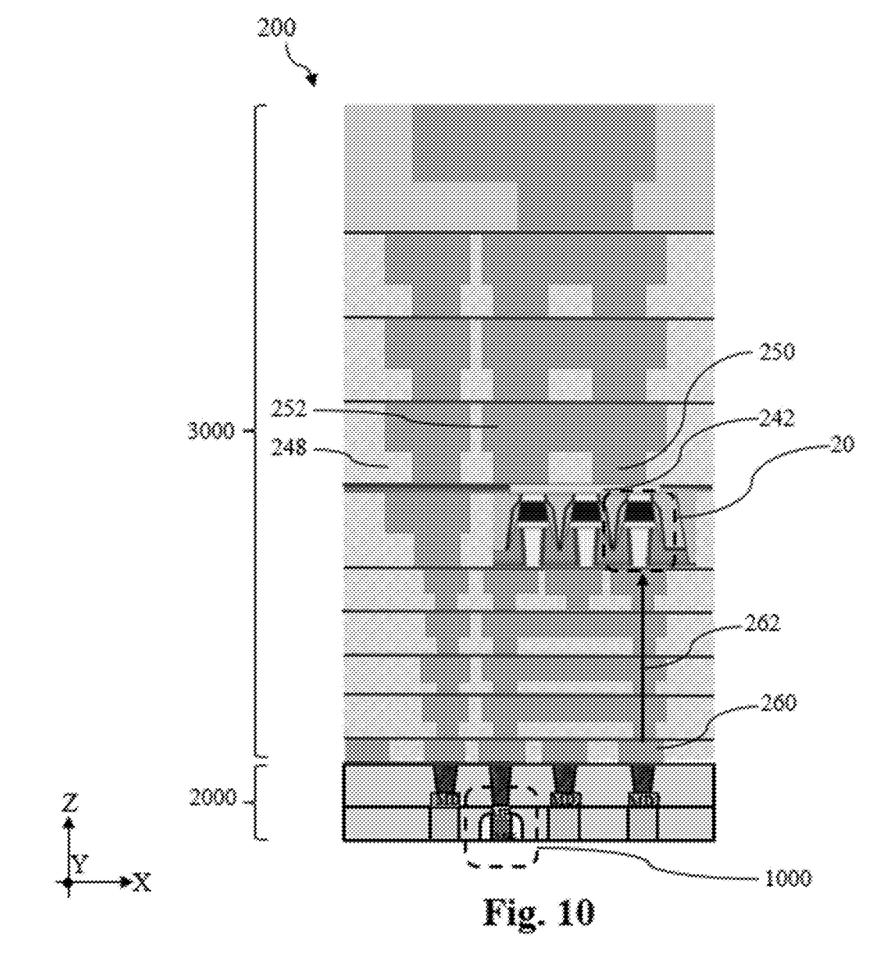

Referring to FIGS. 1 and 10, method 100 includes a block 118 where further processes are performed. Such further processes may include planarization of the workpiece 200 and formation of further interconnect layers over the dielectric layer 248. As shown in FIG. 10, upon conclusion of operations at block 118, the interconnect structure 3000 may include more than 9 interconnect layers, such as between 9 interconnect layers and 10 interconnect layers. Each of the further interconnect layers includes contact vias and conductive lines embedded in an intermetal dielectric (IMD) layer.

Figure 11:
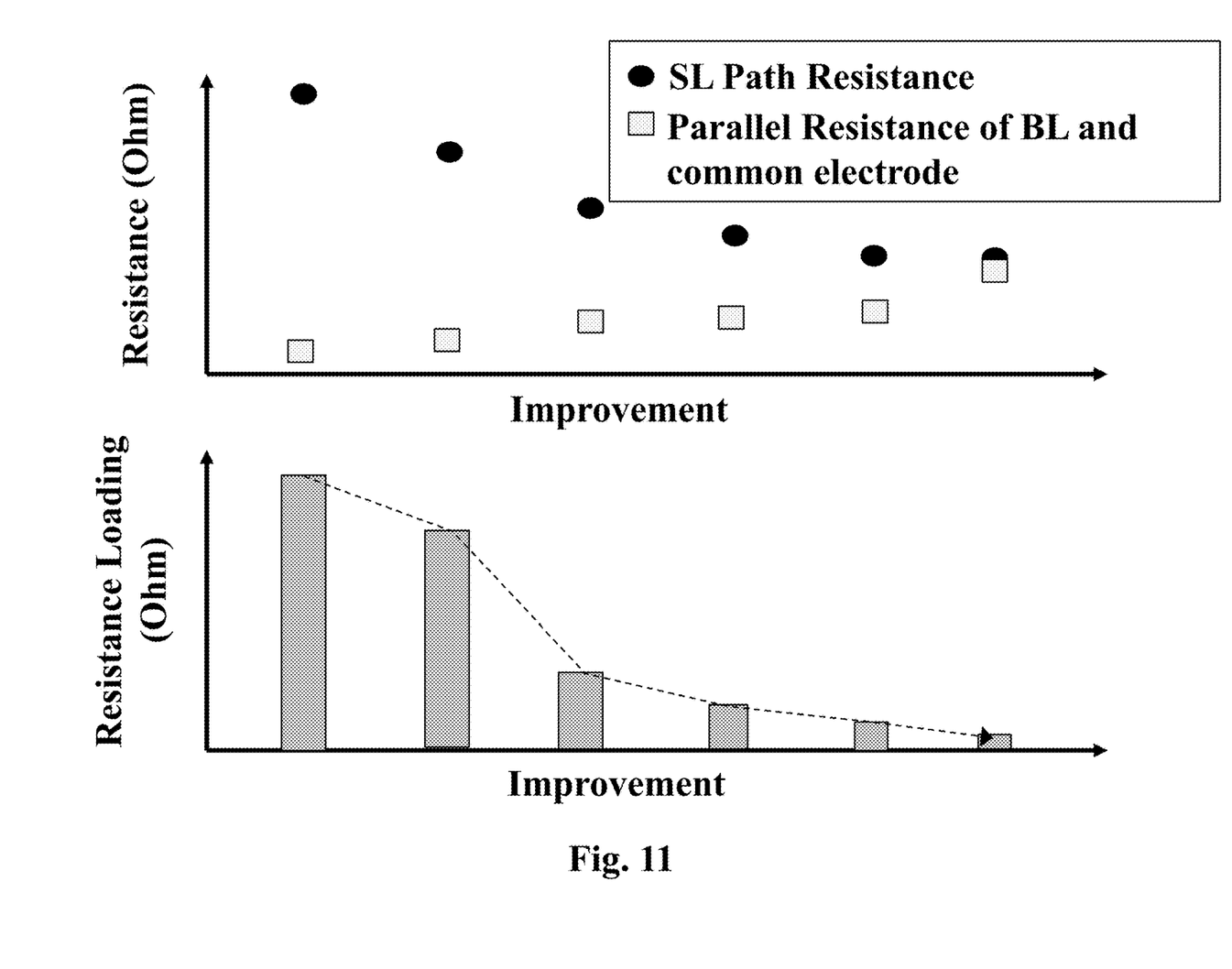
FIG. 11 illustrates improvements to reduce a resistance loading between a source line path and a parallel resistance between a bit line and a common electrode, according to one or more aspects of the present disclosure.

The advantages of the common electrode 242 may be described with reference to FIG. 10. An MRAM bit cell 20 is coupled to transistor 1000 via a source line (SL) 260 in the first metal layer below the MRAM bit cell 20 and the conductive line 252 over the MRAM bit cell 20. The conductive line 252 serves as a bit line and may also be referred to as a bit line (BL) 252. A write signal in the source line (SL) 260 travels upward along a path 262 through the various metal layers below the MRAM bit cell 20. The common electrode 242 is connected in parallel with the bit line (BL) 252 in providing the read signal. During read and write operations of the MRAM bit cell 20, the resistance differential (i.e, resistance loading) between the observed source line resistance (i.e., resistance in the path 262) and the observed bit line resistance (i.e., parallel resistance between the bit line (BL) 252 and the common electrode 242) may impact performance of the MRAM bit cell 20. Reference is now made to FIG. 11, which illustrates improvements to reduce the resistance loading. Due to smaller dimensions of conductive features in the metal layers below the MRAM bit cell, the resistance in the source line (SL) path may be much greater than the parallel resistance in the bit line. Tremendous efforts have been invested to lower the resistance in the source line (SL) path to reduce the resistance loading and improve performance. However, it may be difficult to reduce the resistance in the source line (SL) path enough to eliminate resistance loading. Methods of the present disclosure form the common electrode 242 that reduces the parallel resistance in the bit line (BL). The common electrode 242 is defined in first etch stop layer 228 and has a reduced thickness compared to a conventional top electrode. As shown in FIG. 11, the implementation of the common electrode 242 may constitute the last mile in eliminating the resistance loading between the bit line (BL) and the source line (SL).

Although not intended to be limiting, one or more embodiments of the present disclosure provide benefits to an MRAM structure. In one embodiment, a common electrode is disposed over multiple MRAM bit cells and the common electrode is disposed within a common electrode opening defined in an etch stop layer. A top surface of the common electrode and a top surface of the etch stop layer are coplanar. Because no additional dielectric layers are deposited over the etch stop layer when the common electrode opening is formed, the common electrode is thin. The thin common electrode may increase the parasitic resistance of the common electrode and the bit line (BL) that is coupled to the common electrode, thereby balancing the resistances for the read operation and the write operation.

In one exemplary aspect, the present disclosure is directed to a semiconductor device. The semiconductor device includes a dielectric layer including a top surface, a plurality of magneto-resistive memory cells disposed in the dielectric layer and including top electrodes, a first etch stop layer disposed over the dielectric layer, a common electrode extending through the first etch stop layer to be in direct contact with the top electrodes, and a second etch stop layer disposed on the first etch stop layer and the common electrode.

In some embodiments, a thickness of the first etch stop layer is greater than a thickness of the second etch stop layer. In some implementations, a composition of the common electrode is different from a composition of the top electrodes. In some implementations, the first etch stop layer includes a first nitrogen-containing layer and a first metal oxide layer over the first nitrogen-containing layer and the second etch stop layer includes a second nitrogen-containing layer and a second metal oxide layer over the second nitrogen-containing layer. In some instances, the second nitrogen-containing layer is in contact with the first metal oxide layer. In some instances, the first nitrogen-containing layer and the second nitrogen-containing layer include silicon nitride or silicon carbonitride and the first metal oxide layer and the second metal oxide layer include aluminum oxide, hafnium oxide, or zirconium oxide. In some embodiments, a top surface of the common electrode is coplanar with a top surface of the first metal oxide layer. In some embodiments, a thickness of the first nitrogen-containing layer is greater than a thickness of the first metal oxide layer.

In another exemplary aspect, the present disclosure is directed to a interconnect structure. The interconnect structure includes a dielectric layer including a top surface, a plurality of magneto-resistive memory cells disposed in the dielectric layer and having top electrodes, a first etch stop layer disposed over the dielectric layer, and a common electrode extending through the first etch stop layer to be in direct contact with the top electrodes. A top surface of the common electrode is coplanar with a top surface of the first etch stop layer.

In some embodiments, the interconnect structure further includes a second etch stop layer disposed on the first etch stop layer and the common electrode. In some implementations, a thickness of the first etch stop layer is greater than a thickness of the second etch stop layer. In some implementations, the first etch stop layer includes a first nitrogen-containing layer and a first metal oxide layer over the first nitrogen-containing layer and the second etch stop layer includes a second nitrogen-containing layer and a second metal oxide layer over the second nitrogen-containing layer. In some instances, the first nitrogen-containing layer and the second nitrogen-containing layer include silicon nitride or silicon carbonitride and the first metal oxide layer and the second metal oxide layer include aluminum oxide, hafnium oxide, or zirconium oxide. In some implementations, the first nitrogen-containing layer includes a thickness between about 50 Å and about 200 Å, the first metal oxide layer includes a thickness between about 20 Å and about 100 Å, the second nitrogen-containing layer includes a thickness between about 20 Å and about 100 Å, and the second metal oxide layer includes a thickness between about 10 Å and about 50 Å.

In yet another exemplary aspect, the present disclosure is directed to a method. The method includes receiving a workpiece that includes a dielectric layer and a plurality of magneto-resistive memory cells disposed in the dielectric layer, wherein top electrodes of the plurality of magneto-resistive memory cells are exposed on a top surface of the dielectric layer. The method further includes depositing a first etch stop layer over the workpiece, after depositing the first etch stop layer, patterning the first etch stop layer to form a common electrode opening, wherein the top electrodes are exposed in the common electrode opening, and depositing a common electrode in the common electrode opening.

In some embodiments, the method may further include after the depositing of the common electrode, planarizing the workpiece. After the planarizing, a top surface of the common electrode is coplanar with a top surface of the first etch stop layer. In some instances, the method may further include after the planarizing of the workpiece, depositing a second etch stop layer on the first etch stop layer and on the common electrode. In some instances, a thickness of the first etch stop layer is greater than a thickness of the second etch stop layer. In some embodiments, wherein the depositing of the first etch stop layer includes depositing a first nitrogen-containing layer and depositing a first metal oxide layer on the first nitrogen-containing layer. The depositing of the second etch stop layer includes depositing a second nitrogen-containing layer and depositing a second metal oxide layer on the second nitrogen-containing layer. In some embodiments, a thickness of the first nitrogen-containing layer is greater than a thickness of the second nitrogen-containing layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of magneto-resistive random-access memory (MRAM) cells in a dielectric layer, top surfaces of top electrodes of the plurality of MRAM cells being coplanar with a top surface of the dielectric layer;
    depositing a first etch stop layer (ESL) over the dielectric layer and the plurality of MRAM cells;
    depositing a second ESL over the first ESL;
    forming a common electrode opening in the first ESL and the second ESL to expose each of the top electrodes of the plurality of MRAM cells; and
    forming a common electrode in the common electrode opening such that the top surfaces of the common electrode and the second ESL are coplanar,
    wherein the common electrode is disposed directly on and in electrical communication with each of the top electrodes of the plurality of MRAM cells.

2. The method of claim 1,
    wherein the first ESL is a nitrogen-containing layer,
    wherein the second ESL is metal oxide layer.

3. The method of claim 2, wherein the first ESL comprises silicon nitride or silicon carbonitride.

4. The method of claim 2, wherein the second ESL comprises aluminum oxide, zirconium oxide, or hafnium oxide.

5. The method of claim 2, wherein the first ESL comprises a thickness between about 50 Å and about 200 Å.

6. The method of claim 2, wherein the second ESL comprises a thickness between about 20 Å and about 100 Å.

7. The method of claim 1, wherein a total thickness of the first ESL and the second ESL is between about 200 Å and about 300 Å.

8. The method of claim 1, wherein the common electrode comprises titanium nitride (TiN), tantalum nitride (TaN), aluminum (Al), tungsten (W), nickel (Ni), titanium (Ti), ruthenium (Ru), cobalt (Co), platinum (Pt), or copper (Cu).

9. A method, comprising:
    receiving a workpiece that includes:
        a first dielectric layer,
        a plurality of magneto-resistive random-access memory (MRAM) cells disposed in the first dielectric layer, wherein top electrodes of the plurality of MRAM cells are exposed on a top surface of the first dielectric layer, and
        a plurality of conductive features extending through the first dielectric layer such that top surfaces of the plurality of conductive features are exposed on the top surface of the first dielectric layer;
    depositing a first etch stop layer (ESL) over the first dielectric layer, the MRAM cells, and the plurality of conductive features;
    depositing a second ESL on the first ESL;
    patterning the first ESL and the second ESL to form a common electrode opening; and
    depositing a common electrode in the common electrode opening such that the common electrode is in electrical communication with the top electrodes.

10. The method of claim 9, further comprising:
    depositing a third ESL over the common electrode and the second ESL;

depositing a fourth ESL over the third ESL; and
depositing a second dielectric layer over the fourth ESL.

11. The method of claim 10,
wherein the third ESL comprises silicon nitride or silicon carbonitride,
wherein the fourth ESL comprises aluminum oxide, zirconium oxide, or hafnium oxide.

12. The method of claim 11, wherein a total thickness of the third ESL and the fourth ESL is between about 100 Å and about 200 Å.

13. The method of claim 11, wherein the third ESL comprises a thickness between about between about 20 Å and about 100 Å.

14. The method of claim 11, wherein the fourth ESL comprises a thickness between about 10 Å and about 50 Å.

15. A method, comprising:
receiving a workpiece comprising:
a dielectric layer, and
a plurality of magneto-resistive memory cells disposed in the dielectric layer,
wherein top electrodes of the plurality of magneto-resistive memory cells are exposed on a top surface of the dielectric layer;
depositing a first etch stop layer over the workpiece;
after depositing the first etch stop layer, patterning the first etch stop layer to form a common electrode opening, wherein the top electrodes are exposed in the common electrode opening; and
depositing a common electrode in the common electrode opening.

16. The method of claim 15, further comprising:
after the depositing of the common electrode, planarizing the workpiece,
wherein, after the planarizing, a top surface of the common electrode is coplanar with a top surface of the first etch stop layer.

17. The method of claim 16, further comprising:
after the planarizing of the workpiece, depositing a second etch stop layer on the first etch stop layer and on the common electrode.

18. The method of claim 17, wherein a thickness of the first etch stop layer is greater than a thickness of the second etch stop layer.

19. The method of claim 17,
wherein the depositing of the first etch stop layer comprises:
depositing a first nitrogen-containing layer, and
depositing a first metal oxide layer on the first nitrogen-containing layer,
wherein the depositing of the second etch stop layer comprises:
depositing a second nitrogen-containing layer, and
depositing a second metal oxide layer on the second nitrogen-containing layer.

20. The method of claim 19, wherein a thickness of the first nitrogen-containing layer is greater than a thickness of the second nitrogen-containing layer.

* * * * *